United States Patent
Koyama

(10) Patent No.: US 6,396,144 B1
(45) Date of Patent: *May 28, 2002

(54) MOUNTING STRUCTURE OF SEMICONDUCTOR DEVICE, AND COMMUNICATION APPARATUS USING THE SAME

(75) Inventor: Shunsuke Koyama, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/975,932

(22) Filed: Nov. 21, 1997

(30) Foreign Application Priority Data

Dec. 3, 1996 (JP) .............................................. 8-323201

(51) Int. Cl.⁷ ................................................. H04Q 7/18

(52) U.S. Cl. ........................ 257/728; 257/659; 257/660; 455/296; 455/300; 455/90

(58) Field of Search ............................. 455/73, 90, 118, 455/300, 301, 347, 351, 575, 296; 361/757, 780, 794; 174/35 R, 255, 260, 261; 257/508, 659, 660, 723, 724, 728, 394, 369

(56) References Cited

U.S. PATENT DOCUMENTS

| | | | | | |
|---|---|---|---|---|---|
| 5,107,325 A | * | 4/1992 | Nakayoshi | ................... | 361/400 |
| 5,134,724 A | * | 7/1992 | Gerhing et al. | ............. | 455/344 |
| 5,442,223 A | * | 8/1995 | Fujii | ............................ | 257/508 |
| 5,459,368 A | * | 10/1995 | Onishi et al. | ........... | 310/313 R |
| 5,491,301 A | * | 2/1996 | Akiba et al. | ................. | 174/250 |
| 5,521,419 A | * | 5/1996 | Wakamiya et al. | .......... | 257/508 |
| 5,535,101 A | * | 7/1996 | Miles et al. | .................. | 361/807 |
| 5,564,096 A | * | 10/1996 | Hama et al. | ................. | 455/300 |
| 5,789,303 A | * | 8/1998 | Leung et al. | ................. | 438/381 |
| 5,790,213 A | * | 8/1998 | Sasaki et al. | .................. | 349/48 |
| 5,811,882 A | * | 9/1998 | Latham | ....................... | 257/508 |
| 5,814,848 A | * | 9/1998 | Oshima | ....................... | 257/210 |
| 5,841,197 A | * | 11/1998 | Adamic | ....................... | 257/508 |
| 5,866,943 A | * | 2/1999 | Mertol | ......................... | 257/712 |
| 6,134,428 A | * | 10/2000 | Nakazawa | ................... | 455/300 |
| 6,144,080 A | * | 11/2000 | Wada et al. | ................. | 257/394 |
| 6,180,445 B1 | * | 1/2001 | Tsai | ........................... | 438/23.8 |

FOREIGN PATENT DOCUMENTS

| | | |
|---|---|---|
| JP | 4-317357 | 11/1992 |
| JP | 4-340732 | 11/1992 |
| JP | 5-259217 | 10/1993 |
| JP | 5-315470 | 11/1993 |
| JP | 6-45401 | 2/1994 |
| JP | 6-232201 | 8/1994 |

* cited by examiner

Primary Examiner—Dwayne Bost
Assistant Examiner—Jean A Gelin
(74) Attorney, Agent, or Firm—Oliff & Berridge, PLC

(57) ABSTRACT

An IC mounting structure and a communication apparatus is provided in which the structure of a circuit substrate is improved, the positional relationship between an IC and an antenna member is optimized, and the influence of high-frequency noises from the active surface of the IC can be prevented. In a wrist-fitting communication apparatus, an IC which generates high-frequency noises is face-down bonded on a circuit substrate such that the active surface faces the side opposite to the direction where most of or the entire antenna member is positioned. The circuit substrate is a multilayer substrate in which a shielding electrode layer maintained at the ground potential or a power supply potential is formed. High-frequency noises generated from the active surface of the IC are reduced by the shielding electrode layer. Also, electromagnetic field leaking to the surroundings is weak. Accordingly, the influence of noise upon the antenna member is small.

51 Claims, 7 Drawing Sheets

THE SIDE WHERE MOST OF OR THE ENTIRE ANTENNA MEMBER 4 IS SITUATED

THE SIDE WHERE MOST OF OR THE ENTIRE
ANTENNA MEMBER 4 IS SITUATED

THE SIDE WHERE MOST OF OR THE
ENTIRE ANTENNA MEMBER 4 IS SITUATED

MOUNTING STRUCTURE OF SEMICONDUCTOR DEVICE, AND COMMUNICATION APPARATUS USING THE SAME

BACKGROUND OF THE INVENTION

1. Field of Invention

The invention relates to a mounting structure of a semiconductor device (hereinafter referred to as IC) on a circuit substrate. More particularly, the invention relates to a shielding structure to shield against noises generated by ICs mounted on a circuit substrate.

2. Description of Related Art

Portable transmitters or receivers, watches with FM radios, and watch-type individual-selective-calling receivers are known. In such small sized communication apparatus, for example, a conductive plate or film is arranged in a wristband. This arrangement facilitates fitting the apparatus on a wrist of a user. A loop antenna, i.e., an antenna member, is formed with the plate or film when the wristband is positioned around a wrist.

In such a communication apparatus, as schematically shown in FIG. 7, a circuit substrate 7A is included in the apparatus body. An IC 9 is bonded face-down on a front substrate surface 71A. The front substrate surface 71A faces the side opposing the direction where most of or the entire antenna member 4 is positioned. The IC 9 includes, for example, a high-frequency analog IC 9A, for transmission or reception, and a signal-processing digital IC 9B, which is driven by high-frequency driving signals on the order of a few MHz. The circuit substrate 7A includes a copper coated laminate including a glass-epoxy substrate or a phenol resin substrate as a base member 70A. A copper layer on the front surface of the base member 70A forms a surface pattern 72A for connection to terminals 92 of the IC 9.

Through research concerning influence of high-frequency noise to wrist-fitting-type communication apparatus, for example, the inventor has determined that only low receiving sensitivity and transmitting sensitivity can be achieved when a high-frequency analog IC 9A or a signal-processing digital IC 9B is conventionally face-down bonded on the front surface 71A of a conventional circuit substrate 7A ordinarily used. More specifically, high-frequency noise is generated as indicated by arrow D of FIG. 7 from the active surface 90 (i.e., the surface on which the terminals are exposed, the wiring surface, or the device surface) of the IC 9 including the high-frequency analog IC 9A and the signal-processing digital IC 9B. This high-frequency noise passes directly through the circuit substrate 7A and reaches the antenna member 4, thus lowering the sensitivities.

However, there is a strong demand for size reduction in portable wireless equipment such as mobile cellular phones or PHSs, as well as in wrist-fitting-type communication apparatuses. In order to satisfy such a demand for size reduction, some methods have been offered. Such methods include reduction of circuit area by integration of circuits (forming an IC), or high-density mounting of circuit devices. For such high-density mounting, for example, the size of an IC package may be reduced. ICs may be placed directly on a substrate and connected directly to the substrate by wire bonding. Also, face-down bonding may be employed as disclosed in the invention.

In wireless equipment, noise generated from various circuits in the equipment act as jamming signals when reaching a circuit designed to receive weak signals, such as an antenna or a pre-stage part of a receiver circuit. Also, there is a demand for size reduction in apparatuses. However, the influence of such noise is greater when the antenna, the circuit and other components are more closely disposed relative to each other. Therefore, a significant problem is caused relating to improvement of, for example, receiving sensitivity.

SUMMARY OF THE INVENTION

In view of the foregoing problem, an object of the invention is to provide an IC mounting structure and a communication apparatus including a circuit substrate and a noise causing IC bonded face-down thereon. Thus, the influence of high-frequency noises from the IC upon the surroundings is removed.

Another object of the invention is to provide a structure for a communication apparatus including such an IC mounting structure, wherein the positional relationship between an IC and an antenna member is optimized. Thus, the influence of high-frequency noises from the active surface of the IC upon an antenna member is prevented and sensitivity is improved.

In the invention, "face-down bonding" includes any method employed for surface-to-surface bonding a surface electrode or a wiring lead, previously formed in an IC semiconductor chip, to a wiring electrode formed on a substrate. The arrangement is such that the electrodes are electrically connected to each other. Accordingly, "face-down bonding" also includes "flip-chip bonding".

According to the invention, a shielding electrode layer of a circuit substrate opposes the active surface of the IC. The shielding electrode layer is maintained at a predetermined potential. As a result, even if high-frequency noise is generated from the active surface of the IC, such high-frequency noise is attenuated by the shielding electrode layer. As a result, the electromagnetic field leaking to the surroundings is weak. Therefore, for example, a communication apparatus in accordance with the invention, which uses an IC mounting structure, can utilize high sensitivity since high-frequency noises generated from the active surface of the IC cannot reach the antenna member. Additionally, such shielding against high-frequency noises can be completed by exchanging a conventional circuit substrate with a circuit substrate provided with a shielding electrode layer. Therefore, the invention provides both cost saving and size reduction.

In the invention, the shielding electrode layer is preferably formed at least on the entire area opposing the active surface of the IC. A higher noise-shielding effect can be achieved in relationship to the extent of the area in which the shielding electrode layer is formed. In the invention, the circuit substrate is preferably a multilayer substrate with the shielding electrode layer as an inner layer. With such arrangement, the circuit substrate preferably has a through-hole which conductively connects a surface pattern formed on the substrate surface with the shielding electrode layer. The shielding electrode layer is maintained at the predetermined potential due to the through-hole and the surface pattern. The surface of the circuit substrate has a surface pattern which is necessarily maintained at a potential of a ground or a power supply. As a result, if the surface pattern is conductively connected to the shielding electrode layer through the through-hole, the shielding electrode layer can be maintained at a predetermined potential, i.e., the potential of the ground or a power supply, without additional supply of electricity.

Such a mounting structure of a semiconductor device can be used for enhancing sensitivity of a communication apparatus, for example. In this case, the IC generating high-frequency noises is a high-frequency analog IC which includes at least a transmitting function or a receiving function, a signal-processing digital IC driven by high-frequency driving signals, or an IC of a CPU, for example.

In the invention the IC which generates high-frequency noises is preferably face-down bonded on the circuit substrate such that the active surface faces the side opposing the direction in which most or all of the antenna member is positioned relative to the circuit substrate. According to such arrangement, even if a high-frequency noise generated from the active surface of the IC leaks, the noise will rarely reach the antenna member. Thus, sensitivity of the communication apparatus can be further improved.

In the invention, the communication apparatus may be of a type which fits around the wrist of a user, i.e., wrist-fitting. Further, the body of the apparatus preferably has a front surface that includes a display area. The apparatus further includes a wristband which extends from the apparatus body to the back surface and facilitates fitting the apparatus body on a wrist. The antenna member is formed in the wristband.

BRIEF DESCRIPTION OF THE DRAWINGS

These and other aspects and advantages of the invention will become apparent from the following detailed description of preferred embodiments when taken in conjunction with the accompanying drawings, in which.

DETAILED DESCRIPTION OF PREFERRED EMBODIMENTS

Figure 1:
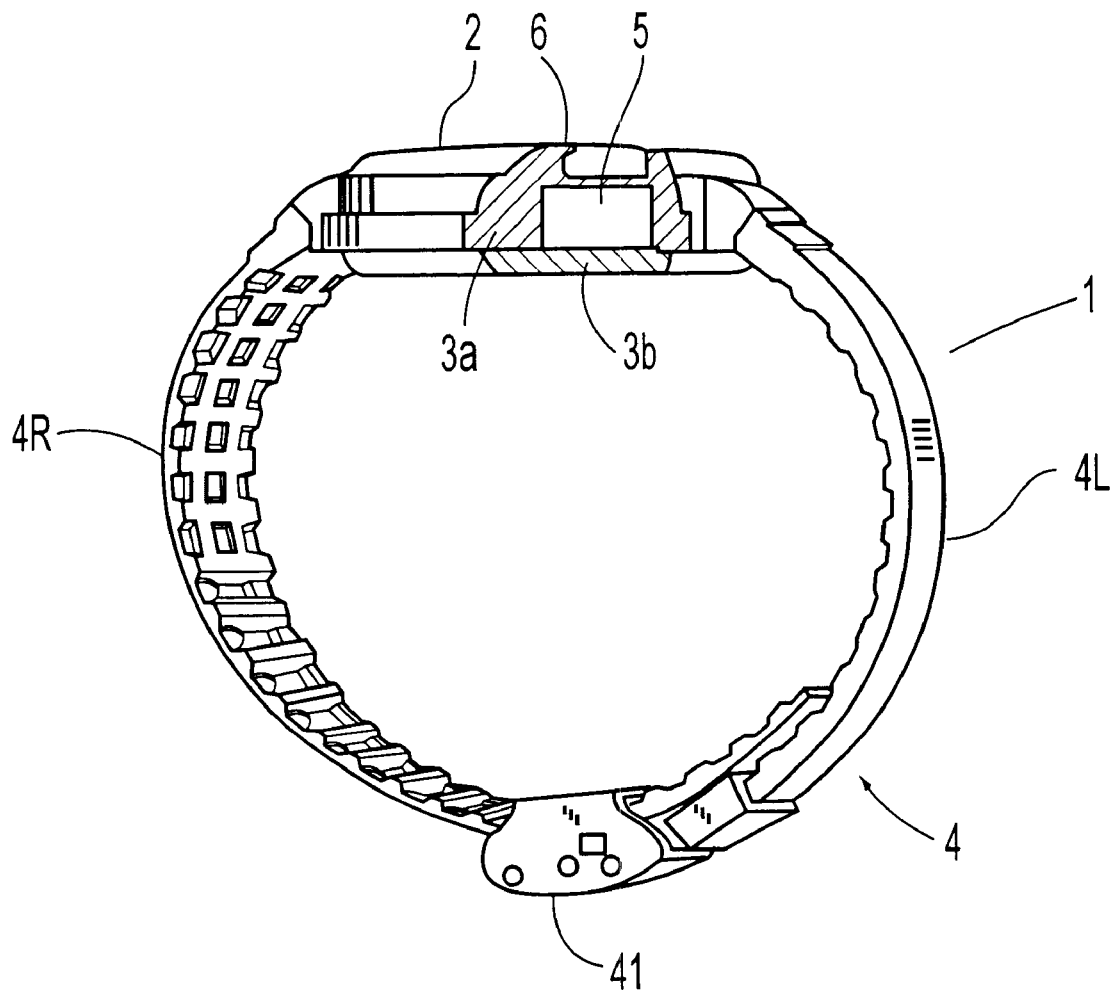
FIG. 1 is a perspective view showing a wrist fitting communication apparatus according to an embodiment of the invention.

While the invention will hereinafter be described in connection with preferred embodiments thereof, it will be understood that it is not intended to limit the invention to those embodiments. On the contrary, it is intended to cover all alternatives, modifications and equivalents that may be included within the spirit and scope of the invention as defined by the appended claims.

For a general understanding of the features of the invention, reference is made to the drawings. In the drawings, like reference numerals have been used throughout to designate like elements.

The invention provides a mounting structure of an integrated circuit including a circuit substrate. An integrated circuit is bonded face-down on the substrate surface. The circuit substrate has a shielding electrode layer opposing the active surface of the integrated circuit. The shielding electrode layer is maintained at a predetermined potential.

FIG. 1 is a diagram showing the structure of a wrist-fitting communication apparatus in accordance with the invention. In FIG. 1, the wrist-fitting communication apparatus 1 includes an apparatus body 2 and a pair of wristbands 4R and 4L. A front surface of the apparatus body 2 includes a liquid-crystal display panel 6. Base ends of the wristbands 4R and 4L are respectively fixed to both ends of the apparatus body. The bands can be mutually connected at their far ends with a buckle 41. Inside the wristbands 4R and 4L, conductive plates are disposed to constitute an antenna member 4, i.e., a loop antenna, when the wristbands 4R and 4L are fitted on a wrist of a user and the ends connected. The apparatus body 2 includes a front casing 3a and a rear cover 3b secured to the rear side of the casing 3a and positioned on the rear side of the apparatus body 2. A circuit assembly 5 is built in the apparatus body 2 and positioned between the casing 3a and the rear cover 3b.

Figure 2A:
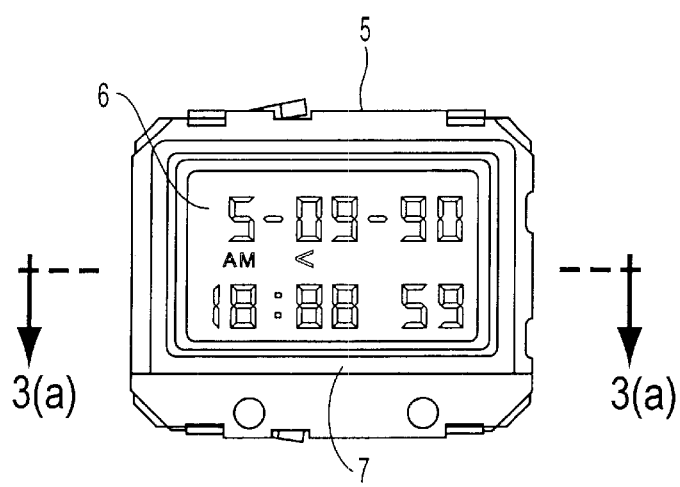
FIGS. 2(a) and 2(b) are top and bottom perspective views, respectively, of a circuit assembly installed in the wrist fitting communication apparatus shown in FIG. 1 in accordance with an embodiment of the invention.
Figure 2B:
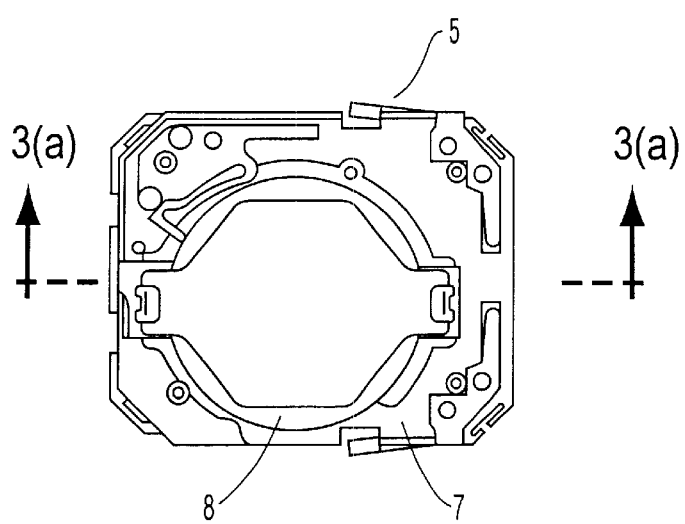
Figure 3A:
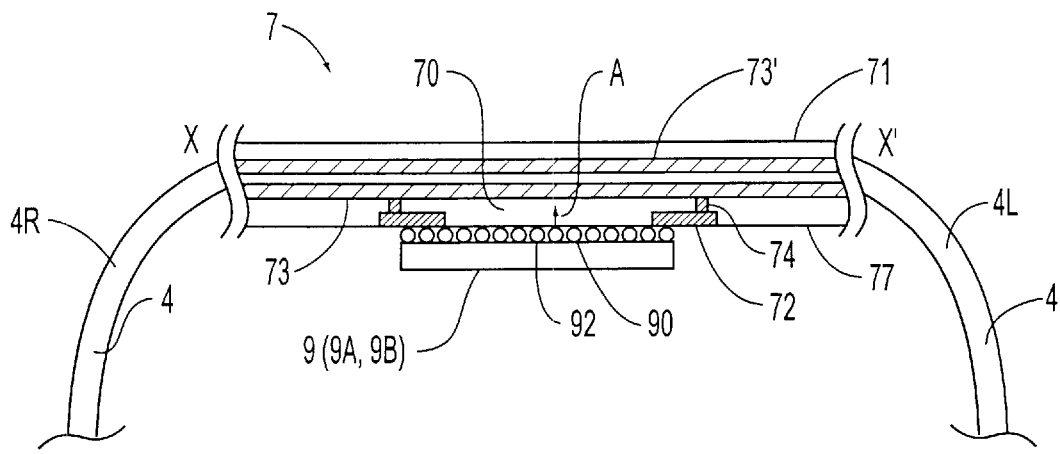
FIG. 3(a) is a schematic sectional diagram of a main part of the circuit assembly taken along plane 3(a)—3(a) in FIG. 2(a) and 2(b) in accordance with an embodiment of the invention.

FIGS. 2(a) and (b) show the front and rear surfaces, i.e. top and bottom surfaces, of the circuit assembly 5, respectively. FIG. 3(a) is a diagram schematically showing the cross-section of the circuit assembly 5 along the line 3(a)—3(a) in FIGS. 2(a) and (b).

As shown in FIGS. 2(a) and (b), the main components of the circuit assembly are laminated inside the apparatus body 2 in a direction parallel to the thickness of the apparatus body. More specifically, a liquid crystal panel 6, a circuit substrate 7 and a circuit-driving battery 8 are disposed in the circuit assembly 5 parallel to the thickness of the circuit assembly.

As shown in FIG. 3(a), antenna member 4 is positioned in the wristbands 4R and 4L and extends toward the rear surface side relative to the circuit substrate 7. The antenna member 4 does not have to be directly secured to the circuit substrate 7 so long as it is electrically connected to terminal sections of the circuit substrate 7. The antenna member 4 may be press-bonded or wire-connected with leads.

An IC 9 generates high-frequency noises. The IC 9 includes a high-frequency analog IC 9A, having transmitting and receiving functions, and a signal-processing digital IC 9B, for example, which are bonded face-down on the rear surface 77 of the circuit substrate 7. The antenna member 4 is formed when the distal ends of the wrist bands 4R and 4L are fitted about a wrist and connected. Most of the antenna 4 is positioned on the rear surface side of the apparatus body 2. Accordingly, the active surface 90 of each component of IC 9, such as the high-frequency analog IC 9A and the signal-processing digital IC 9B, faces the circuit substrate 7, i.e., the side where the liquid crystal display panel 6 is situated, but does not face the direction where most of or the entire antenna 4 is situated. Among the IC 9 components, the high-frequency analog IC 9A transmits and receives signals of high frequency on the order of several tens MHz to several hundred MHz. As a result, the high frequency analog IC 9A generates high-frequency noises from its active surface 90, as indicated by the arrow A. The signal-processing digital IC 9B includes a digital circuit, for sampling received signals prior to analog/digital conversion, and a phase locked loop circuit. The signal-processing digital IC 9B is driven by high frequency driving signals on the order of several MHz and generates high-frequency noises from its active surface 90 as indicated by arrow A.

In this embodiment, a multilayer substrate is used as a circuit substrate 7. This circuit substrate 7 includes a base member 70 formed with a glass-epoxy substrate or a phenol resin substrate. Surface patterns 72, i.e., wiring patterns, are formed on the base member 70. In the inner layer portion of the circuit substrate 7, a shielding electrode layer 73 is formed on an area corresponding to a mounting area for the IC 9, i.e., the area opposing the active surface 90 of the IC 9. The shielding electrode layer 73 may have a single layer, two layers or more layers laminated and positioned parallel to the thickness of the circuit substrate 7, for example, as illustrated as the shielding electrode layer 73'.

In the circuit substrate 7, a plurality of through-holes 74 are formed around the area for mounting the IC 9. The through-holes 74 electrically connect the shielding electrode layer 73 to a surface pattern 72 maintained at a ground or power supply potential. The surface patterns 72 are electrically connected to the terminals 92 of the IC 9.

Figure 3B:
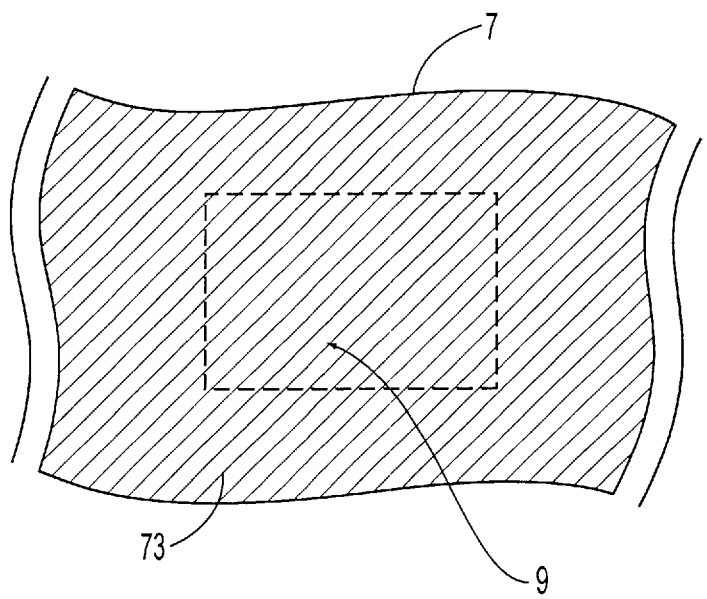
FIG. 3(b) is a plan view showing the area of a shielding electrode layer formed on a circuit multilayer substrate installed in the circuit assembly in accordance with an embodiment of the invention.

In this embodiment, the area of the shielding electrode layer 73 is larger than the area for mounting the IC 9 as shown in FIG. 3(b), which is a plan view of a shielding electrode layer 73. The shielding electrode layer 73 is formed to cover the entire area for mounting the IC 9.

In the wrist-fitting communication apparatus 1 having the above described structure, the circuit substrate 7 has the shielding electrode layer 73 opposing the active surface 90 of the IC 9. The shielding electrode layer 73 is maintained at a ground or a power supply potential through the through-holes 74 and the surface pattern 72. High-frequency noises are generated, as indicated by the arrow A, from the active surface 90 of the IC 9 including the high-frequency analog IC 9A, the signal-processing digital IC 9B and other components. However, high-frequency noises generated from the active surface 90 of the IC 9 are reduced by the shielding electrode layer 73. Further, the electromagnetic field leaking to the surroundings is weak. As a result, each circuit portion and the antenna member 4 in the wrist-fitting communication apparatus 1 is not adversely affected by high-frequency noises generated from the active surface 90 of the IC 9. Additionally, shielding against high-frequency noises in accordance with the invention can be accomplished by exchanging a conventional circuit substrate with a circuit substrate 7 provided with a shielding electrode layer 73. The invention therefore provides cost savings and enhances size reduction.

The shielding electrode layer 73 is formed as a solid electrode pattern on an area larger than the area for mounting the IC 9. The noise-shielding effect is thereby high. Since the shielding electrode layer 73 is formed essentially as an inner layer of the multilayer substrate, the shielding electrode layer 73 does not obstruct mounting of other parts on the front surface 71 or the rear surface 77 of the circuit substrate 7. Further, the surface pattern 72, essentially maintained at a ground or a power supply potential, is formed on the surface of the circuit substrate 7. The surface pattern 72 is conductively connected to the shielding electrode layer 73 through the through-holes 74. Accordingly, the shielding electrode layer 73 can be maintained at a predetermined potential, a ground potential or a power supply potential, without any further supply of electricity.

In addition, the active surface 90 of each component of IC 9 on the rear surface 77 of the circuit substrate 7, such as the high-frequency analog IC 9A and the signal-processing digital IC 9B, face the circuit substrate 7, i.e., the side where the liquid crystal display panel 6 is located. However, the active surface 90 of each component of IC 90 does not face the direction where most of the antenna member 4 is situated. Accordingly, even if a high-frequency noise generated from the active surface 90 of the IC 9 leaks, the noise will rarely reach the antenna member 4. The communication apparatus 1 according to the invention, therefore, has high sensitivity.

Figure 4A:
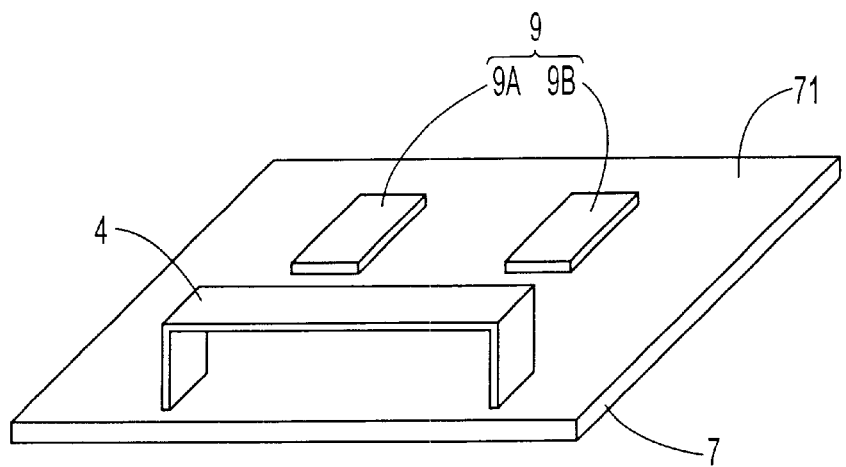
FIG. 4(a) is a perspective view showing the disposition of an antenna member and a circuit substrate in the wrist-fitting communication apparatus according to another embodiment of the invention.

A communication apparatus is described above in which an antenna member is included in wristbands for fitting the apparatus body on a wrist. However, the mounting structure according to the invention can be applied to a communication apparatus in which ICs 9 and an antenna member 4 are formed on a common circuit substrate 7, as shown in FIG. 4(a). In the following embodiments, components having functions similar to those in the above described embodiment are indicated by the same numerals, and details regarding them have been omitted.

Figure 4B:
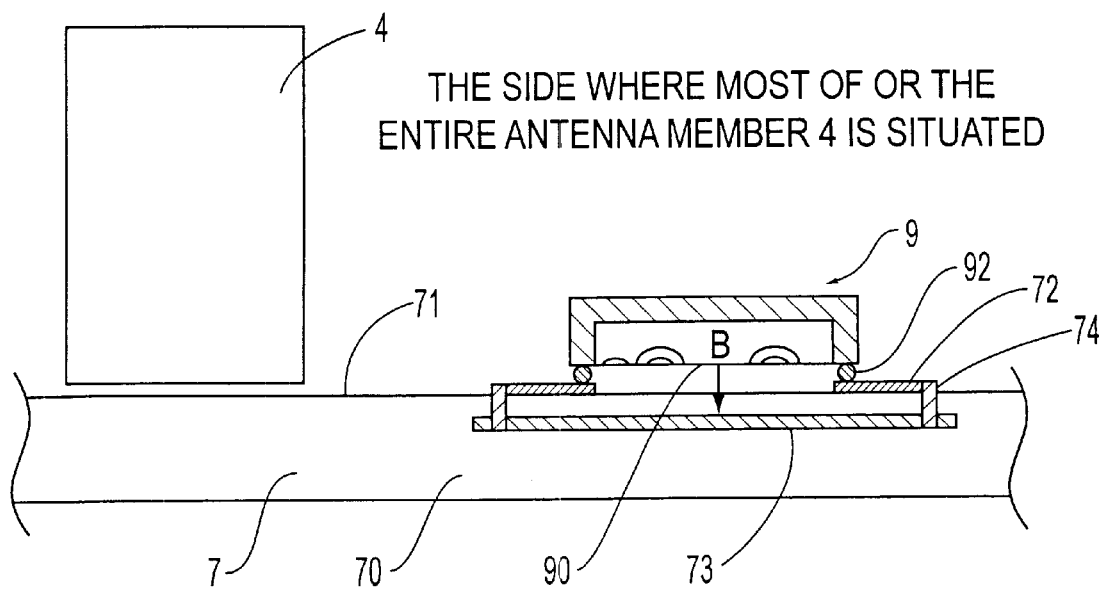
FIG. 4(b) is a longitudinal sectional view showing the IC mounting structure on the circuit substrate in accordance with an embodiment of the invention.

FIG. 4(a) is a perspective schematic view showing the arrangement of an antenna member and a circuit substrate in a communication apparatus according to another embodiment of the invention. FIG. 4(b) is a longitudinal sectional view of an apparatus in accordance with the invention.

As shown in FIGS. 4(a) and (b), the wrist-fitting communication apparatus 1 of this embodiment includes a circuit substrate on which various electronic parts are mounted. An antenna member 4 is formed on the front surface 71 of the circuit substrate 7. Electronic parts, for example, ICs 9, such as a high-frequency analog IC 9A and a signal-processing digital IC 9B, which generate high-frequency noises, are bonded face-down on the front surface 71 of the circuit substrate 7. Accordingly, the active surface 90 of each of the ICs 9, such as a high-frequency analog IC 9A and a signal-processing digital IC 9B, faces the circuit substrate 7. More specifically, the active surface 90 of the ICs 9 face the side where a liquid crystal display panel 6 is positioned, but does not face the direction where most of or the entire antenna member 4 is positioned.

Further, the circuit substrate 7 is a multilayer substrate similar to that shown in to FIGS. 3(A) and (B), and includes a base member 70 formed with a glass-epoxy substrate or a phenol resin substrate. The circuit substrate 7 further includes surface patterns 72, i.e., wiring patterns, formed thereon. A shielding electrode layer 73 is formed in an inner layer portion of the circuit substrate 7 on an area corresponding to an area for mounting the ICs 9, i.e., an area opposing the active surfaces 90 of the ICs 9. Also, the circuit substrate 7 has through-holes 74 which electrically connect the shielding electrode layer 73 to surface patterns 72. Surface patterns 72 are maintained at a ground potential or a power supply potential and are electrically connected to terminals 92 of the ICs 9.

Accordingly, similar to the above described embodiment, in the communication apparatus of this embodiment, high-frequency noises are generated from the active surfaces 90 of the ICs 9 as indicated by arrow B. However, the high-frequency noises generated from the active surfaces 90 of the ICs 9 are reduced by the shielding electrode layer 73 and the electromagnetic field leaking to the surroundings is weak. Such shielding is provided since the shielding electrode layer 73 opposes the active surfaces 90 of the ICs 9 while being maintained at the ground potential or a power supply potential through the through-holes 74 and the surface patterns 72. In addition, the active surfaces 90 of the ICs 9 face the circuit substrate 7, but do not face the direction where most of or the entire antenna member 4 is situated. Accordingly, even if a high-frequency noise generated from the active surfaces 90 of the ICs 9 leaks, the noise will rarely reach the antenna member 4. Thus, the communication apparatus can provide high sensitivity similar to the first described embodiment.

Figure 5A:
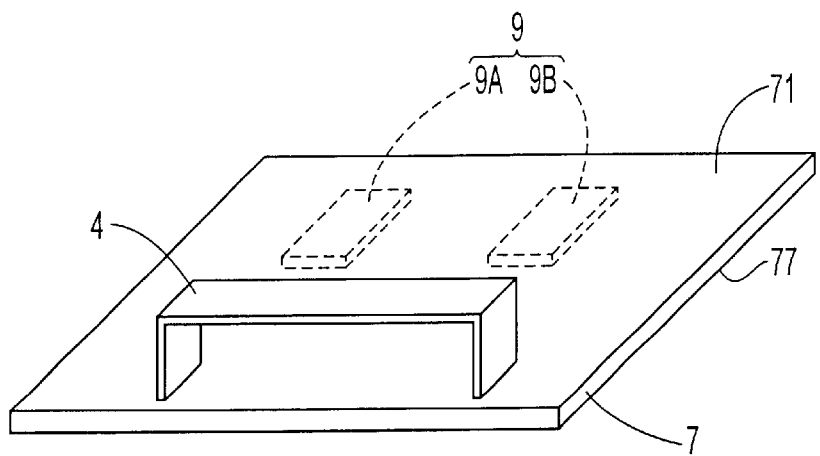
FIG. 5(a) is a perspective view showing an antenna member and a circuit substrate in the wrist-fitting communication apparatus according to another embodiment of the invention.
Figure 5B:
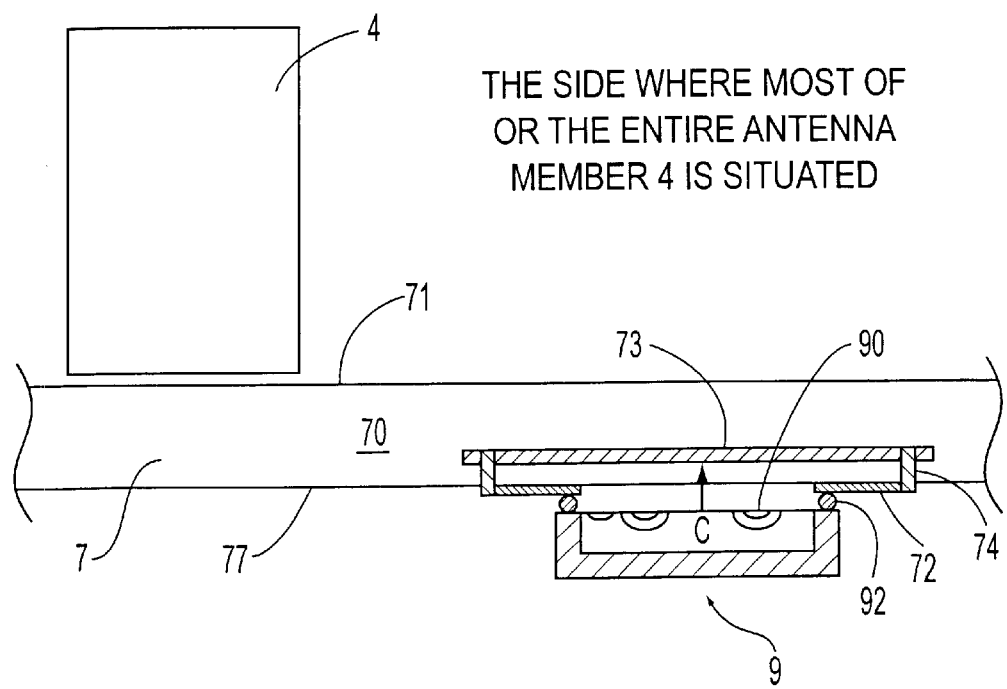
FIG. 5(b) is a longitudinal sectional view showing the IC mounting structure on the circuit substrate in accordance with the embodiment of the invention shown in FIG. 5(a)

In accordance with the invention, the influence of high-frequency noise generated from the active surface of the IC on the antenna member is prevented by the shielding electrode layer in the multilayer substrate. The invention can be applied to the communication apparatus 1 having ICs 9 which cause high-frequency-noise. Such ICs 9 may include, for example, a high-frequency analog IC 9A and a signal-processing digital IC 9B and may be face-down bonded on a rear surface 77 of a circuit substrate 7, as shown in FIGS. 5(*a*) and (*b*). The rear surface 77 opposes the surface of the circuit substrate 7 on which antenna member 4 is mounted.

In this embodiment the antenna member 4 is mounted on the front surface 71 of the circuit substrate 7. The high-frequency noise causing ICs 9, such as a high-frequency analog IC 9A and a signal-processing digital IC 9B, are face-down bonded on the rear surface 77 of the circuit substrate 7, as shown in FIGS. 5(*a*) and (*b*). Accordingly, the active surface 90 of each of the ICs 9, such as a high-frequency analog IC 9A and a signal-processing digital IC 9B, actually face the direction where most of or the entire antenna member 4 is situated. The circuit substrate 7 is a multilayer substrate, as illustrated in FIGS. 3(A) and (B) and described above, and includes a base member 70 formed with a glass-epoxy substrate of a phenol resin substrate and surface patterns, i.e., wiring patterns 72, are formed thereon. A shielding electrode layer 73 is included in the inner layer portion of the circuit substrate 7 and located in an area corresponding to the area for mounting the ICs 9, i.e., the area opposing the active surface of the ICs 9. Further, the circuit substrate 7 is provided with through-holes 74 which electrically connect the shielding electrode layer 73 to surface patterns 72. The surface patterns 72 are maintained at the ground potential or a power supply potential and are electrically connected to terminals 92 of the ICs 9.

Accordingly, similar to the first described embodiment, in the communication apparatus of this embodiment, high-frequency noises are generated from the active surfaces 90 of the ICs 9 as indicated by the arrow C. However, the high-frequency noises generated from the active surfaces 90 of the ICs 9 are reduced by the shielding electrode layer 73 and the electromagnetic field leaking to the surroundings is weak. Such shielding is provided since the shielding electrode layer 73 opposes the active surfaces 90 of the ICs 9 while being maintained at the ground potential or a power supply potential through the through-holes 74 and the surface patterns 72. Therefore, in this embodiment the noise generated from the active surfaces 90 of the ICs 9 will rarely reach the antenna member 4.

Figure 6A:
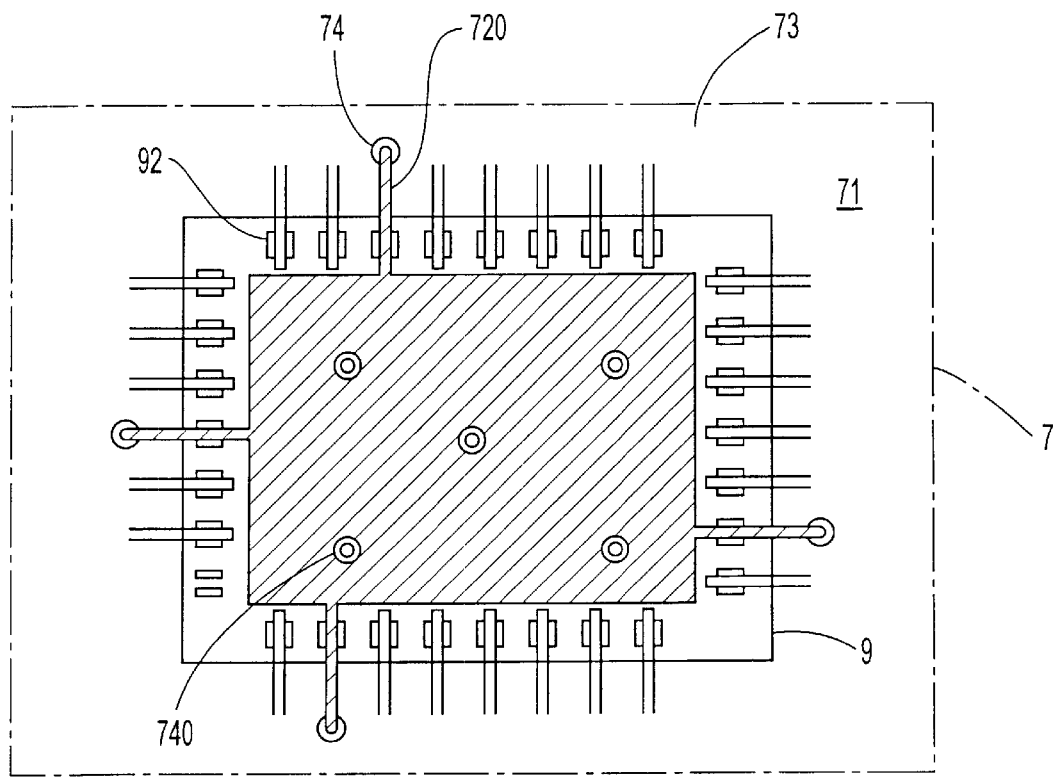
FIG. 6(a) is a diagram of the IC mounting structure for a communication apparatus according to another embodiment of the invention when the IC is viewed from above.
Figure 6B:
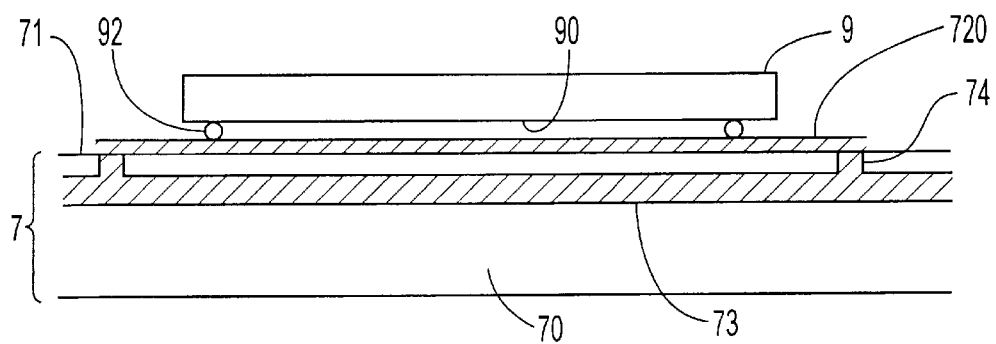
FIG. 6(b) is a longitudinal sectional view of the IC mounting structure of FIG. 6(a) in accordance with the invention.
Figure 7:
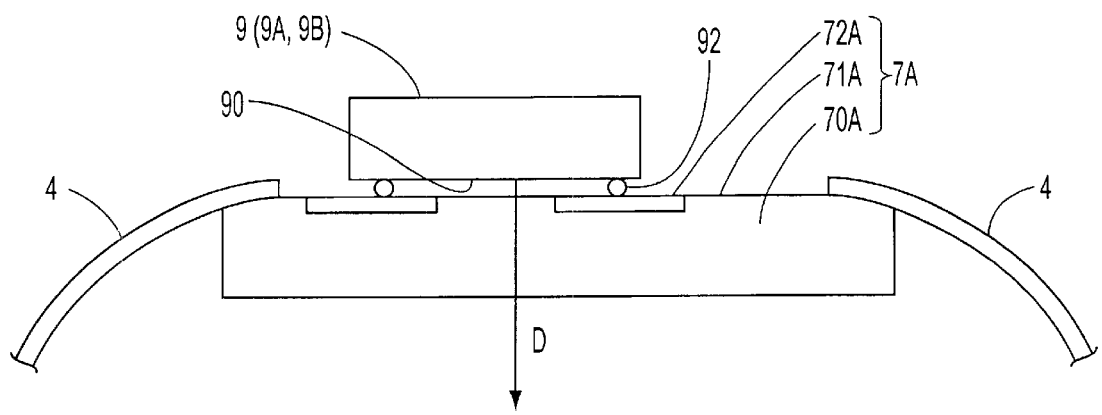
FIG. 7 is a longitudinal sectional view showing a conventional IC-mounting structure.

FIG. 6(*a*) is a perspective diagram of the IC mounting structure in accordance with an embodiment of a communication apparatus of the invention when the IC is viewed from above. FIG. 6(*b*) is a longitudinal sectional view of the structure shown in FIG. 6(*a*).

As shown in FIGS. 6(*a*) and (*b*), in the communication apparatus of this embodiment, a surface pattern 720 (the area designated with cross hatching) is formed on the front surface 71 of a circuit substrate 7 and functions as a shielding electrode layer. High-frequency noises are generated from the active surface 90 of an IC 9. IC 9 is face-down bonded on the circuit substrate 7. More specifically, in this embodiment, the surface pattern 720, having a large area, is formed on the front surface 71 of the circuit substrate 7 in a region beneath the IC 9. Surface pattern 720 is formed so as not to cover wiring patterns and terminals other than the terminals used for shielding the IC 9. The surface pattern 720 is maintained at the potential of the ground or a power supply. In such arrangement, since the shielding portion is just beneath the IC 9, a high shielding effect can be achieved.

Further, the circuit substrate 7 is a multilayer substrate which includes a base member 70 formed with a glass-epoxy substrate or a phenol resin substrate. A shielding electrode layer 73 is formed in an inner layer portion of the base member 70 on an area corresponding to the area for mounting the IC 9, i.e. an area opposing the active surfaces 90 of the IC 9. On the base member 70, shielding surface pattern 720 and the shielding electrode layer 73 are electrically connected with through-holes 74. Accordingly, even if high-frequency noises are generated from the active surface 90 of the IC 9, the high-frequency noises are reduced by the surface pattern 720 and the shielding electrode layer 73. As a result, the electromagnetic field leaking to the surroundings is extremely weak.

The through-holes 74 electrically connect the surface pattern 720 to the shielding electrode layer 73. One or more of through-holes 740 may be formed in the area for mounting the IC 9, as shown in FIG. 6(*a*). As a result, shielding against the active surface 90 of the IC 9 can be achieved within a relatively small area on the circuit substrate 7.

A loop antenna is used as an antenna member 4 in each of the embodiments described above. However, a slot antenna may be used in which slits are formed in the longitudinal direction of the antenna member. Further, the antenna member 4 does not necessarily have to be formed on the same circuit substrate 7 on which the IC 9 is mounted. The antenna member 4 may be formed on a substrate other than the circuit substrate 7. Even with such an arrangement, the influence of high-frequency noises generated from the active surface 90 of the IC 9 on the antenna member 4 can be prevented by disposing a shielding electrode layer 73 on the circuit substrate 7 such that the shielding electrode layer 73 opposes the active surface 90 of the IC 9 and is maintained at the potential of the ground or a power supply.

Additionally, the antenna member 4 may be formed on a substrate other than the circuit substrate 7. Also, the IC 9, which generates high-frequency noises, may be packaged on the circuit substrate 7 such that the active surface 90 faces the side opposite to the direction where most of or the entire antenna member 4 is positioned relative to the circuit substrate 7. With such an arrangement, high-frequency noises which may be generated from the active surface 90 of the IC 9 will rarely affect the antenna member 4. Thus, high sensitivity of the communication apparatus can be achieved.

Also, a double-sided substrate may be used as a circuit substrate 7. A shielding electrode layer 73 may be formed on the substrate surface opposite to the substrate surface where an IC 9 is mounted. Further, the shielding electrode layer 73 should preferably be formed into a solid electrode layer having an area as large as possible for obtaining the maximum effect. However, the shielding electrode layer 73 may also be patterned into a predetermined shape in order to avoid other wiring patterns and through-holes.

Further, the structure provided for mounting ICs 9 according to the invention can be applied to any type of communication apparatus such as a watch with an FM radio, a watch-type individual-selective-calling receiver, a pocket pager, a mobile cellular phone and a PHS. Further, in addition to such communication apparatuses, the invention can be applied to any apparatuses requiring prevention of the influence of high-frequency noises generated by ICs 9.

As illustrated above, in the IC mounting structure according to the invention, a shielding electrode layer of a circuit substrate opposes the active surfaces of ICs. The shielding electrode layer is maintained at a predetermined potential. According to the invention, even if a high-frequency noise is generated from the active surface of an IC, such high-frequency noise is attenuated by the shielding electrode layer. Further, the electromagnetic field leaking to the surroundings is weak.

The shielding effect is larger when the shielding plate is disposed closer to active circuits. Therefore, the mounting structure according to the invention includes a markedly larger shielding plate closely disposed to active circuits, as compared to other conventional mounting structures. As a result, the invention achieves a higher shielding effect. Therefore, the IC mounting structure according to the invention when applied, for example, to a communication apparatus, can achieve high sensitivity since high-frequency noises generated from ICs do not reach the antenna member.

Additionally, in a case where the active surfaces of high-frequency noise causing ICs are emitted in a direction opposite to where most or all of the entire antenna member is situated relative to the circuit substrate, even if a high-frequency noise is generated from the active surface of an IC, such a high-frequency noise rarely reaches the antenna member. Therefore, a highly sensitive communication apparatus can be obtained.

While the invention has been described in conjunction with specific embodiments thereof, it is evident that many alternatives, modifications and variations may be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A mounting structure of a semiconductor device, comprising:
    a circuit substrate having a substrate surface and a shielding electrode layer; and
    an integrated circuit having an active surface facing the substrate surface of the circuit substrate,
    wherein the shielding electrode layer of the circuit substrate extends sustantially parallel to the active surface of said integrated circuit and shields noises generated by said integrated circuit, said shielding electrode layer being maintained at a predetermined potential.

2. The mounting structure of a semiconductor device according to claim 1, wherein said shielding electrode layer is formed at least over an entire area opposing the active surface of said integrated circuit.

3. The mounting structure of a semiconductor device according to claim 1, wherein said circuit substrate is a multilayer substrate including said shielding electrode layer as an inner layer.

4. The mounting structure of a semiconductor device according to claim 3, wherein the substrate surface has a surface pattern and said circuit substrate defines a through-hole which conductively connects the surface pattern formed on the substrate surface to said shielding electrode layer, and said shielding electrode layer is maintained at the predetermined potential through said through-hole and said surface pattern.

5. The mounting structure of a semiconductor device according to claim 1, wherein said shielding electrode layer is maintained at a potential of at least one of a ground and a power supply.

6. A communication apparatus comprising the mounting structure of a semiconductor device according to claim 1, and an antenna member used for at least one of transmission and reception.

7. The communication apparatus according to claim 6, wherein said integrated circuit includes at least one of a high-frequency analog integrated circuit and a signal-processing digital integrated circuit driven by high-frequency signals.

8. The communication apparatus according to claim 7, wherein said high-frequency analog integrated circuit provides at least one of a transmitting function and a receiving function.

9. The communication apparatus according to claim 6, wherein said integrated circuit is face-down bonded on said circuit substrate such that the active surface faces a side of said circuit substrate opposite to the direction where at least most of the antenna member is positioned relative to said circuit substrate.

10. The communication apparatus according to claim 9, wherein said integrated circuit is face-down bonded by a packaging method of electrically connecting one of a surface electrode and a wiring lead provided on the integrated circuit to a wiring electrode provided on the circuit substrate, surface to surface.

11. The communication apparatus according to claim 6, further comprising:
    an apparatus body having a front surface that includes a display area, and
    a wristband which extends from the apparatus body away from a back surface of said apparatus body,
    said wristband facilitating fitting the apparatus body on a wrist, and
    said antenna member being formed in said wristband.

12. The communication apparatus according to claim 6, wherein said integrated circuit is face-down bonded on said circuit substrate such that said antenna member is positioned in an area which does not directly face said active surface of said integrated circuit.

13. The communication apparatus according to claim 6, wherein said antenna member is positioned in an area which does not directly face said active surface of said integrated circuit.

14. The communication apparatus according to claim 6, the antenna member being provided within a mobile phone.

15. The communication apparatus according to claim 6, the antenna member being provided on at least one of the circuit substrate on which the integrated circuit is mounted, and another substrate different from the circuit substrate.

16. The mounting structure of a semiconductor device according to claim 1, wherein said circuit substrate is a multilayer substrate including a plurality of shielding electrode layers formed in one of portions of a front surface, a rear surface and inner layers of said multilayer substrate.

17. The mounting structure of a semiconductor device according to claim 16, wherein the substrate surface has a surface pattern and said circuit substrate defines a through-hole which conductively connects the surface pattern formed on the substrate surface to said plurality of shielding electrode layers, and said shielding electrode layers are maintained at the predetermined potential through-hole and said surface pattern.

18. The mounting structure of a semiconductor device according to claim 16, wherein at least one of said plurality of shielding electrode layers is at least provided over an entire area opposing the active surface of said integrated circuit, said plurality of shielding electrode layers being maintained at a predetermined potential.

19. The mounting structure of a semiconductor device according to claim 1, wherein said circuit substrate is a double-sided substrate including said shielding electrode layer formed on a substrate surface opposite to a substrate surface where said integrated circuit is mounted.

20. The mounting structure of a semiconductor device according to claim 1, the shielding electrode layer having a surface that faces the active surface of the integrated circuit.

21. The mounting structure of a semiconductor device according to claim 1, the the shielding electrode layer having a surface that opposes the active surface of the integrated circuit.

22. The mounting structure of a semiconductor device according to claim 1, the circuit substrate having a proximate surface that is proximate the active surface of the integrated circuit, the shielding electrode layer being disposed at the proximate surface.

23. The mounting structure of a semiconductor device according to claim 1, the circuit substrate having a proximate surface that is proximate the active surface of the integrated circuit and an opposite surface that is opposite the proximate surface, the shielding electrode layer being disposed at the opposite surface.

24. The mounting structure of a semiconductor device according to claim 1, the active surface of the integrated circuit being directed to the shielding layer of the circuit substrate.

25. A mounting structure of a semiconductor device, comprising:
    an integrated circuit having an active surface; and
    circuit substrate means having a substrate surface for supporting the integrated circuit that faces the substrate surface of the circuit substrate means, said circuit substrate means having a means for shielding that faces the active surface of said integrated circuit and that shields noises generated by said integrated circuit,
    wherein said means for shielding is maintained at a predetermined potential.

26. The mounting structure of a semiconductor device according to claim 25, wherein the means for shielding includes a shielding electrode layer, and said shielding electrode layer is formed at least on an entire area opposing the active surface of said integrated circuit.

27. The mounting structure of a semiconductor device according to claim 25, wherein said circuit substrate means is a multilayer substrate including a shielding electrode layer as an inner layer.

28. The mounting structure of a semiconductor device according to claim 27, wherein the substrate surface has a surface pattern and said circuit substrate means defines a through-hole which conductively connects the surface pattern formed on the substrate surface to said means for shielding, and said means for shielding is maintained at the predetermined potential through said through-hole and said surface pattern.

29. The mounting structure of a semiconductor device according to claim 25, wherein said means for shielding is maintained at a potential of at least one of a ground and a power supply.

30. A communication apparatus comprising;
    the mounting structure of a semiconductor device according to claim 11; and
    an atenna member used for at least one of transmission and reception.

31. The communication apparatus according to claim 30, the antenna member being provided within a mobile phone.

32. The communication apparatus according to claim 30, the antenna member being provided on at least one of the circuit substrate on which the integrated circuit is mounted, and another substrate different from the circuit substrate.

33. The mounting structure of a semiconductor device according to claim 25, wherein said circuit substrate means is a multilayer substrate including a plurality of shielding electrode layers formed in one of portions of a front surface, a rear surface and inner layers of said multilayer substrate.

34. The mounting structure of a semiconductor device according to claim 33, wherein at least one of said plurality of shielding electrode layers is at least provided over an entire area opposing the active surface of said integrated circuit.

35. The mounting structure of a semiconductor device according to claim 33, wherein the means for shielding includes a plurality of shielding electrode layers, and said shielding electrode layers are formed at least on an entire area opposing the active surface of said integrated circuit.

36. The mounting structure of a semiconductor device according to claim 25, wherein said circuit substrate is a double-sided substrate including said shielding electrode layer formed on a substrate surface opposite to a substrate surface where said integrated circuit is mounted.

37. A method of mounting a semiconductor device, said method comprising the steps of:
    positioning an integrated circuit to face a substrate surface of a circuit substrate,
    positioning a shielding electrode layer to face an active surface of said integrated circuit and to shield noises generated by said integrated circuit, and
    maintaining said shielding electrode layer at a predetermined potential.

38. A method of mounting a semiconductor device, said method comprising the steps of:
    positioning an integrated circuit to face a substrate surface of a circuit substrate,
    positioning a shielding electrode layer to face an active surface of said integrated circuit and to shield noises generated by said integrated circuit, and
    maintaining said shielding electrode layer at a predetermined potential.

39. The method of claim 17, further comprising the step of forming said shielding layer on at least an entire area opposing the active surface of said integrated circuit.

40. The method of claim 17, wherein said circuit substrate is a multilayer substrate including said shielding layer as an inner layer.

41. The mounting structure of a semiconductor device according to claim 1, the shielding electrode layer having a surface that faces the active surface of the integrated circuit.

42. The method of claim 37, wherein said circuit substrate is a double-sided substrate including said shielding electrode layer formed on a substrate surface opposite to a substrate surface where said integrated circuit is mounted.

43. A mounting structure of a semiconductor device, comprising:

a circuit substrate having a substrate surface and a shielding electrode layer; and a plurality of integrated circuits having an active surfaces facing the substrate surface of the circuit substrate, wherein the shielding electrode layer of the circuit substrate faces at least a part of the active surfaces of said integrated circuits and shields noises generated by said plurality of integrated circuits, said shielding electrode layer being maintained at a predetermined potential.

44. The mounting structure of a semiconductor device according to claim 43, wherein said circuit substrate is a multilayer substrate including a plurality of shielding electrode layers formed in one of portions of a front surface, a rear surface and inner layers of said multilayer substrate.

45. The mounting structure of a semiconductor device according to claim 44, wherein at least one of said plurality of shielding electrode layers is at least provided over an entire area opposing the active surface of said integrated circuit.

46. The mounting structure of a semiconductor device according to claim 44, wherein the substrate surface has a surface pattern and said circuit substrate defines a through-hole which conductively connects the surface pattern formed on the substrate surface to said plurality of shielding electrode layers, and said shielding electrode layers are maintained at the predetermined potential through said through-hole and said surface pattern.

47. The mounting structure of a semiconductor device according to claim 44, wherein at least one of said plurality of shielding electrode layers is at least provided over an entire area opposing the active surface of said integrated circuit, said plurality of shielding electrode layers being maintained at a predetermined potential.

48. The mounting structure of a semiconductor device according to claim 43, wherein said circuit substrate is a double-sided substrate including said shielding electrode layer formed on a substrate surface opposite to a substrate surface where said integrated circuit is mounted.

49. A mounting structure of a semiconductor device, comprising:

a circuit substrate having a substrate surface and a shielding electrode layer; and an integrated circuit having an active surface facing the substrate of the circuit substrate, wherein the shielding electrode layer of the circuit substrate faces the active surface of said integrated circuit and shields noises generated by said integrated circuit and wired patterns connected thereto, said shielding electrode layer being maintained at a predetermined potential.

50. A mounting structure of a semiconductor device, comprising:

an integrated circuit having an active surface; and circuit substrate means having a substrate surface for supporting the integrated circuit that faces the substrate surface of the circuit substrate means, said circuit substrate means having a means for shielding that faces the active surface of said integrated circuit and that shields noises generated by said integrated circuit and wired patterns connected thereto, wherein said means for shielding is maintained at a predetermined potential.

51. A method of mounting a semiconductor device, said method comprising the steps of:

positioning an integrated circuit to face a substrate surface of a circuit substrate, positioning a shielding layer to face an active surface of said integrated circuit and to shield noises generated by said integrated circuit and wired patterns connected thereto, and maintaining said shielding layer at a predetermined potential.

* * * * *